United States Patent
Thompson

(10) Patent No.: US 7,386,284 B2
(45) Date of Patent: Jun. 10, 2008

(54) CONTROLLING THE GAIN OF A REMOTE ACTIVE ANTENNA

(75) Inventor: Charles D. Thompson, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 517 days.

(21) Appl. No.: 11/001,282

(22) Filed: Dec. 1, 2004

(65) Prior Publication Data

US 2006/0116097 A1    Jun. 1, 2006

(51) Int. Cl.
*H04B 17/00* (2006.01)

(52) U.S. Cl. .............................. 455/115.3; 455/232.1; 455/82; 455/13.2; 455/12.1; 455/3.02; 348/722; 348/731

(58) Field of Classification Search ............... 455/115, 455/232.1, 82, 83, 115.3, 13.2, 427, 3.02, 455/12.1; 348/722, 731
See application file for complete search history.

(56) References Cited

U.S. PATENT DOCUMENTS

| 6,724,827 | B1 | 4/2004 | Patsiokas et al. ........... 375/259 |
| 7,230,734 | B2* | 6/2007 | Hirata ........................ 358/1.15 |
| 2005/0216937 | A1* | 9/2005 | Shintani et al. ................ 725/72 |
| 2005/0250541 | A1* | 11/2005 | Bird et al. .................. 455/561 |

* cited by examiner

*Primary Examiner*—Sanh D. Phu
(74) *Attorney, Agent, or Firm*—Trop, Pruner & Hu, P.C.

(57) ABSTRACT

A receiver includes a tuner and a circuit. The tuner receives an indication of a radio frequency signal from an antenna feedline in response to the radio frequency signal being provided to the antenna feedline by an amplifier. The circuit transmits a control signal to the antenna feedline to control a gain of the amplifier in response to a strength of the radio frequency signal.

23 Claims, 5 Drawing Sheets

CONTROLLING THE GAIN OF A REMOTE ACTIVE ANTENNA

BACKGROUND

The invention generally relates to controlling the gain of a remote active antenna.

A satellite radio receiver system typically includes a satellite tuner, an active antenna and a coaxial antenna feedline that connects the antenna to the tuner. The active antenna typically includes an antenna and a low noise amplifier that compensates for loss in the antenna feedline and for the noise figure of the satellite tuner. The amplifier of the active antenna typically has a fixed amplification gain that is optimized for weak signal reception from the satellite.

In a conventional mobile satellite radio receiver system (a satellite radio system that is installed in an automobile, for example), the strength of the radio frequency (RF) signal that is received from the satellite varies due to satellite signal blockages due to buildings, trees, rain, hills, etc. The effect of the signal blockages may be reduced in an urban area that has high power terrestrial repeaters that are located strategically throughout the urban area. When a mobile satellite radio receiver system is near a terrestrial repeater antenna, the strength of the received RF signal may be large enough to overload an RF tuner of the system, and as a result, bit errors may occur. A typical solution to this dilemma involves adjusting the gain of the RF tuner according to the strength of the received RF signal. However, this solution may not be optimal because the RF tuner needs to be linear in operation over a wide range of potential gains, and this linearity may be difficult to achieve.

Thus, there exists a continuing need for better ways to adjust the response of a satellite radio receiver system to the signal strength of an RF signal.

SUMMARY

In an embodiment of the invention, a technique includes generating a signal that is indicative of the strength of a radio frequency signal that is produced by an amplifier driving an antenna feedline. The technique includes controlling a gain of the amplifier in response to the signal.

In another embodiment of the invention, a receiver includes a tuner and a circuit. The tuner receives an indication of a radio frequency signal from an antenna feedline in response to the radio frequency signal being provided to the antenna feedline by an amplifier. The circuit transmits a control signal to the antenna feedline to control a gain of the amplifier in response to a strength of the radio frequency signal.

In another embodiment of the invention, a system includes an antenna to provide a radio frequency signal, an antenna feedline, an amplifier and a circuit. The amplifier amplifies the radio frequency signal to provide an amplified radio frequency signal to the antenna feline. The circuit receives an indication of the amplified radio frequency signal from the antenna feedline and generates a control signal to control the gain of the amplifier in response to the indication.

In another embodiment of the invention, a system includes an antenna to provide a satellite radio frequency signal, an antenna feedline, an amplifier, a satellite receiver and a circuit. The amplifier amplifies the satellite radio frequency signal to provide an amplified satellite radio frequency signal to the antenna feedline. The satellite receiver is coupled to the antenna feedline to generate an audio signal in response to the amplified satellite radio frequency signal. The circuit generates a control signal to control a gain of the amplifier in response to a strength of the satellite radio frequency signal.

In yet another embodiment of the invention, a receiver includes a tuner and a circuit. The tuner receives a first radio frequency signal in response to an antenna receiving a second radio frequency signal from at least one of a terrestrial repeater and a satellite. The circuit transmits a control signal to an antenna feedline to compensate for a signal strength difference between the second radio frequency signal primarily originating from the terrestrial repeater and the second radio frequency signal primarily originating from the satellite.

Advantages and other features of the invention will become apparent from the following drawing, description and claims.

DETAILED DESCRIPTION

Figure 1:
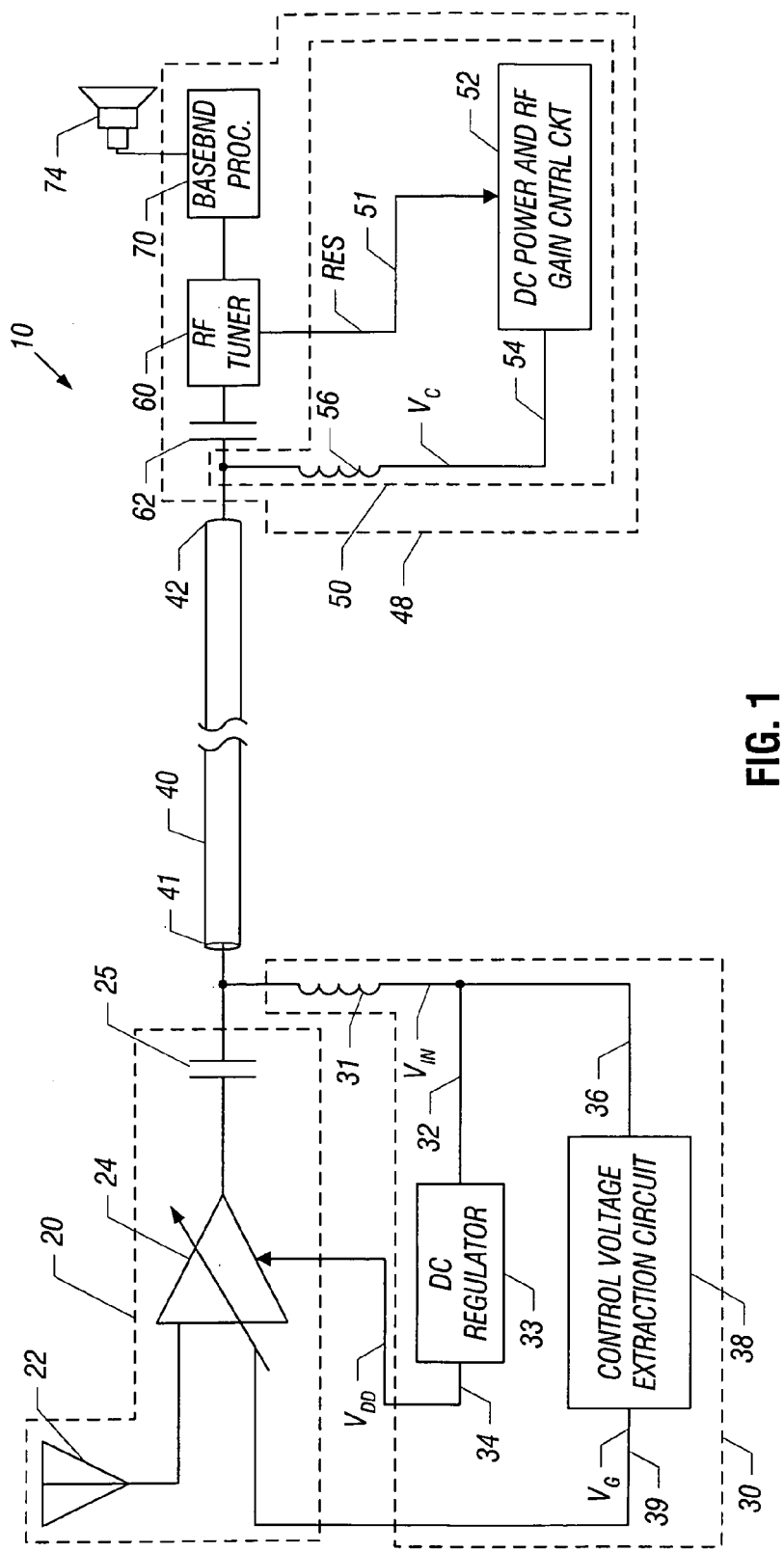
FIG. 1 is a schematic diagram of a satellite radio receiver system according to an embodiment of the invention.

Referring to FIG. 1, an embodiment 10 of a satellite radio receiver system in accordance with the invention includes an active antenna 20, an antenna feedline 40 and a satellite tuner 48. The active antenna 20 includes an antenna 22 that converts to electromagnetic energy that propagates from a satellite into an incoming radio frequency (RF) signal.

The active antenna 20 also includes a low noise amplifier (LNA) 24 that amplifies the incoming RF signal to provide an amplified RF signal at an output terminal of the LNA 24. As a more specific example, in some embodiments of the invention, the LNA 24 and antenna 22 may be packaged together in an active antenna module, so that the LNA 24 is located next to the antenna 22 for purposes of ensuring essentially no signal loss occurs between the antenna 22 and the input terminals of the LNA 24.

As described further below, the RF amplification gain of the LNA 24 is controlled by the satellite radio receiver system 10 based on the detected strength (the magnitude of the carrier signal, for example) of the incoming RF signal. Due to this control, the strength of the RF signal that propagates throughout the rest of the satellite radio receiver system 10 (from the LNA 24) is regulated so that a high strength RF signal (a signal received near a terrestrial repeater, for example) does not overload an RF tuner 60 of the system 10.

By controlling the receiver system RF gain at the active antenna 20, rather than at other circuitry (such as at the RF tuner 60) of the system 10, linearity of the system 10 may be improved, as compared to prior art satellite receiver systems. Furthermore, the third order input intercept point (IIP3) requirements (the requirements that characterize the receiver's tolerance to several signals that are present simultaneously outside the desired passband) of the RF tuner 60 are decreased, thereby allowing improved system performance.

The amplified RF signal propagates from the output terminal of the LNA 24 through a DC-blocking capacitor 25 to a remote end 41 (relative to the satellite tuner 48) of the antenna feedline 40. Thus, the LNA 24 drives the antenna feedline 40 with the amplified RF signal. In some embodiments of the invention, the antenna feedline 40 may be a coaxial cable that includes a central conductor (the main signal path) that is surrounded by a metal sheath (the ground path). In some embodiments of the invention, the antenna feedline 40 may be longer than one foot, such as three to six feet, as an example.

At the near end 42 of the antenna feedline 40 (relative to the satellite tuner 48), the antenna feedline 40 communicates the RF signal to the satellite receiver, or tuner 48. In some embodiments of the invention, the satellite tuner 48 includes a DC-blocking capacitor 62 that is coupled between the near end 42 of the antenna feedline 40 and the RF tuner 60 (of the satellite tuner 48). The satellite tuner 48 may be a single integrated semiconductor package (a "chip") or a "chip set," depending on the particular embodiment of the invention.

The RF tuner 60 demodulates the received RF signal to produce an intermediate frequency (IF) signal that is processed by a baseband processor 70 of the satellite tuner 48. The baseband processor 70, in turn, produces an audio signal that drives a speaker 74. The depiction of the satellite radio receiver system 10 in FIG. 1 is simplified for purposes of focusing on certain aspects of the invention. It is understood, however, that the satellite radio receiver 10 may include many other components (buffering components that drive the speaker 74, components that form a user interface for the system 10, etc.) in the various embodiments of the invention.

For purposes of controlling the gain of the LNA 24 of the active antenna 20, in some embodiments of the invention, the RF tuner 60 determines the strength of the incoming RF signal. More specifically, in accordance with some embodiments of the invention, the RF tuner 60 provides a signal (called "RF_S" in FIG. 1) that indicates the strength of the RF signal that is received by the RF tuner 60. As a more specific example, in some embodiments of the invention, the RF_S signal may indicate the magnitude of the carrier signal of the RF signal that is received by the RF tuner 60. Alternatively, in other embodiments of the invention, another component (the baseband processor 70, for example) may determine the strength of the RF signal.

Thus, the RF_S signal also indicates the strength of the RF signal that is received by the satellite radio receiver system 10 and is amplified by the LNA 24. As described below, in response to the RF_S signal, the satellite system 10 controls the RF amplification gain of the LNA 24 in a feedback loop to ensure that the RF signal that is received by the RF tuner 60 is not of a sufficient strength to overload the RF tuner 60.

More particularly, in some embodiments of the invention, the satellite tuner 48 includes a circuit 50 to communicate a control signal to the antenna feedline 40 for purposes of controlling the RF amplification gain of the LNA 24. In this regard, in some embodiments of the invention, the circuit 50 includes a DC power and RF gain control circuit 52 that receives (via an input line 51) the RF_S signal from the RF tuner 60. In response to the RF_S signal, the circuit 52 generates a control voltage (called "$V_C$"), the level, or magnitude, of which indicates an RF amplification gain for the LNA 24. Thus, for example, in some embodiments of the invention, the $V_C$ control signal has a larger magnitude for a higher gain for the LNA 24 and a smaller magnitude for a smaller gain for the LNA 24. Alternatively, in other embodiments of the invention, the $V_C$ control signal may be inversely related to the amplification gain of the LNA 24. Thus, many variations are possible in the various embodiments of the invention.

For purposes of communicating the $V_C$ control signal to the LNA 24, in some embodiments of the invention, the output terminal 54 (on which the $V_C$ control signal appears) of the circuit 52 is coupled to the near end 42 of the antenna feedline 40. As depicted in FIG. 1, in some embodiments of the invention, a filtering choke 56, or inductor, may be coupled between the output terminal 54 and the near end 42 of the antenna feedline 40.

In some embodiments of the invention, the circuit 52 and RF tuner 60 may be fabricated on the same die and may be part of a semiconductor packer, or "chip."

Thus, the antenna feedline 40 communicates the $V_C$ control signal across the antenna feedline 40 from the near end 42 to the remote end 41. A circuit 30 that is located near the remote end 41 of the antenna feedline 40 receives an indication of the $V_C$ control signal from the antenna feedline 40. In other words, the circuit 30 receives the DC voltage present at the remote end 41 of the antenna feedline 40. In response to this DC voltage, the circuit 30 generates a control voltage signal (called "$V_G$") that is provided directly to the LNA 24 for purposes of controlling the amplification gain of the LNA 24.

More specifically, in some embodiments of the invention, the circuit 30 includes a control voltage extraction circuit 38 that receives (at its input terminal 36) a DC voltage signal (called "$V_{IN}$"). The $V_{IN}$ signal is provided by one terminal of a filtering choke 31, or inductor, that is coupled between the end 41 of the antenna feedline 40 and the input terminal 36 of the control voltage extraction circuit 38. Due to the DC-blocking capacitor 25, the $V_{IN}$ signal is the DC voltage that appears at the remote end 41 of the antenna feedline 40.

In response to the $V_{IN}$ signal, the control voltage extraction circuit 38 generates the $V_G$ control signal. Depending on the particular embodiment of the invention, the $V_G$ control signal may control the gate voltage of a current source, a gate voltage of a current mirror of a feedback resistance of the LNA 24 (as just a few examples) to control the RF amplification gain of the LNA 24. Regardless of the specific technique used, the $V_G$ control signal directly affects the RF amplification gain of the LNA 24. Therefore, in response to the generation of the $V_C$ control signal by the DC power and RF gain control circuit 52, the RF amplification gain of the LNA 24 is adjusted accordingly.

Because the active antenna 20 is remotely located from the satellite tuner 48, the active antenna 20 and its associated remote circuitry may not include a direct source of power (provided via an automobile's electrical system, for example). Therefore, in some embodiments of the invention, for purposes of powering the LNA 24 as well as its associated components, power is communicated across the antenna feedline 40. In this regard, in some embodiments of the invention, the $V_{IN}$ signal that is received from the antenna feedline 40 is also used to power the LNA 24. Therefore, in some embodiments of the invention, the $V_{IN}$ signal is a combined gain and power signal, in that the $V_{IN}$ signal: provides power to the components of the satellite system 10 located at the remote end 41 of the antenna feedlines 40; and simultaneously, b.) controls the RF amplification gain of the LNA 24.

To use the $V_{IN}$ signal to power components on the remote end 41 of the antenna feedline 40, the circuit 30 includes a DC regulator 33, in some embodiments of the invention. The DC regulator 33 includes an input terminal 32 that receives the $V_{IN}$ signal, and in response to the $V_{IN}$ signal being within an expected range (described below), the DC regulator 33, furnishes a regulated and constant supply voltage (called "$V_{DD}$") to the LNA 24.

In some embodiments of the invention, the control voltage extraction circuit 38 performs a linear mapping of the $V_{IN}$ signal to the $V_G$ control signal. This linear mapping may include upwardly or downwardly amplifying the $V_{IN}$ signal, as well as adding an offset to the $V_{IN}$ signal to produce the $V_G$ control signal. Although a linear mapping is described herein, a nonlinear mapping may be used in other embodiments of the invention.

Figure 2:
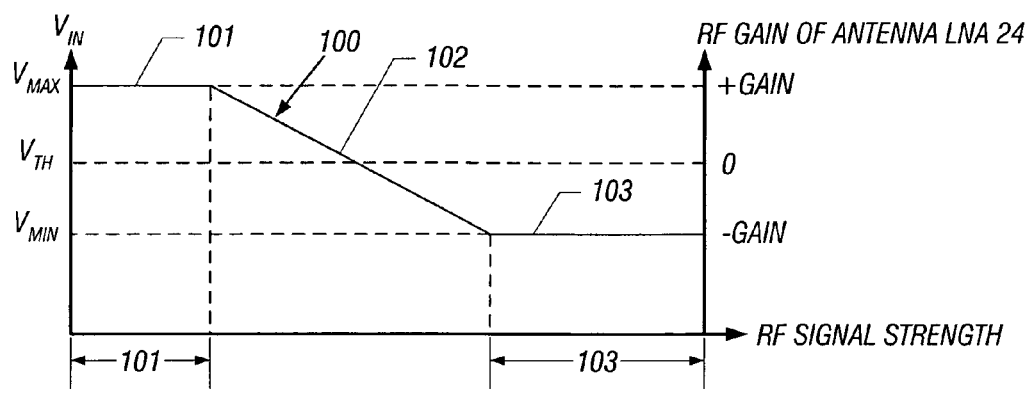
FIG. 2 depicts a relationship between a control voltage and the strength of a radio frequency signal and depicts a relationship between an amplification gain of an active antenna and the strength of the radio frequency signal according to an embodiment of the invention.

As a more specific example, FIG. 2 depicts a waveform 100 that illustrates a relationship between the $V_{IN}$ signal and the strength of the incoming RF signal, according to some embodiments of the invention. The $V_{IN}$ signal has a minimum voltage (called "$V_{MIN}$"), which is the minimum input voltage for the DC regulator 33 (see also FIG. 1). When the $V_{IN}$ signal is between the $V_{MIN}$ threshold voltage and an upper threshold voltage (called "$V_{MAX}$"), the DC regulator 33 provides the regulated $V_{DD}$ supply voltage. Therefore, regardless of the magnitude of the $V_{IN}$ signal in this range, the DC regulator 33 provides the constant $V_{DD}$ supply voltage.

However, the magnitude of the $V_{IN}$ signal (within the range defined by the $V_{MIN}$ and $V_{MAX}$ thresholds) determines the RF amplification gain of the LNA 24. Thus, as depicted in FIG. 2, the waveform 100 has a region 102 that causes incremental increases or decreases in the RF signal strength to produce corresponding incremental changes in the gain of the LNA 24. As depicted in FIG. 2, in some embodiments of the invention, the region 102 may be a generally linear region in that a given change in the RF signal strength (as indicated by the $V_{IN}$ signal) produces a proportionate change in the $V_{IN}$ voltage. However, other relationships (non-linear relationships, for example) are possible, in other embodiments of the invention.

The waveform 100 reaches and is limited to the $V_{MAX}$ threshold level (by the circuit 52 (FIG. 1)) when the strength of the incoming RF signal falls within a low power range 101. In the range 101, the RF amplification gain of the LNA 24 is maximized, in that the $V_{IN}$ signal is driven to the $V_{MAX}$ threshold. Conversely, when the RF signal strength is within a maximum strength region 103, the $V_{IN}$ signal is driven to the lower $V_{MIN}$ voltage threshold, a setting that causes the RF amplification gain of the LNA 24 to be at its minimum setting.

It is noted that in the context of the this application, the "amplification" of the incoming RF signal by the LNA 24 does not necessarily imply that the signal at the output terminal of the LNA 24 has a larger magnitude than the magnitude of the signal at the input terminal of the LNA 24. Thus, in some embodiments of the invention, the LNA 24 may reduce the strength of the incoming signal (still considered "amplification" and a "gain" in the context of this application) so that at the output terminal of the LNA 24, the RF signal strength is less than at the input terminal of the LNA 24. This is particularly the case for a relatively high strength incoming RF signal in which the LNA 24 attenuates the signal.

The amplification by the LNA 24 is depicted in FIG. 2, in that at a threshold (called "$V_{TH}$") that is located between the $V_{MAX}$ and $V_{MIN}$ thresholds, the $V_{IN}$ signal indicates a zero decibel (dB) gain for the amplifier 24. When the $V_{IN}$ signal is above the $V_{TH}$ threshold, then the LNA 24 has an RF amplification gain greater than unity. Conversely, when the $V_{IN}$ signal falls below the $V_{TH}$ threshold, the amplification gain of the LNA 24 is less than unity.

Figure 3:
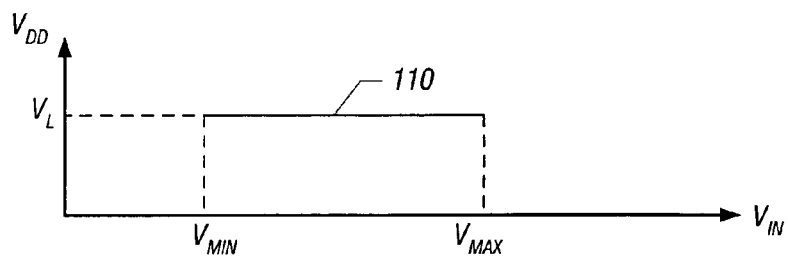
FIG. 3 depicts a relationship between a supply voltage and a control signal that is communicated over an antenna feedline according to an embodiment of the invention.

FIG. 3 depicts a relationship 110 between the $V_{DD}$ supply voltage and the $V_{IN}$ signal. As shown, as long as the $V_{IN}$ signal remains between the $V_{MIN}$ and $V_{MAX}$ thresholds, the DC regulator 33 regulates the $V_{DD}$ supply voltage so that the $V_{DD}$ supply voltage remains at a relatively constant voltage level (called "$V_L$").

Figure 4:
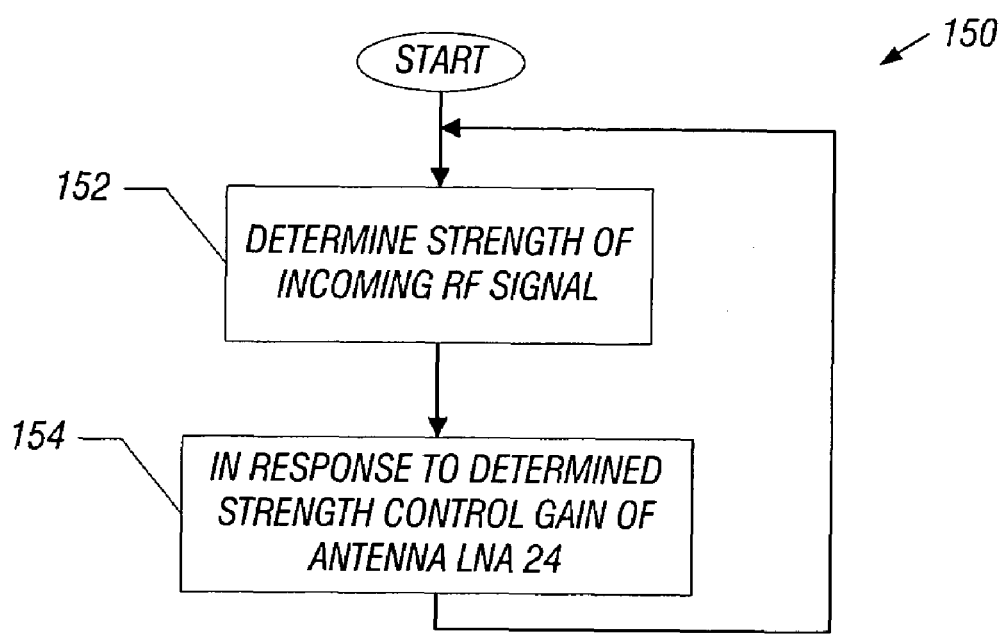
FIGS. 4, 5 and 6 are flow diagrams depicting techniques to control the gain of an amplifier of an active antenna according to embodiments of the invention.

Therefore, to summarize, a technique 150 (FIG. 4) may be used in conjunction with a satellite radio receiver system in accordance with some embodiments of the invention. Referring to FIG. 4, this technique 150 includes determining (block 152) the strength of an incoming RF signal, as depicted in block 152. In response to the determined strength, the RF amplification gain of the LNA 24 is controlled, as depicted in block 154.

Figure 5:
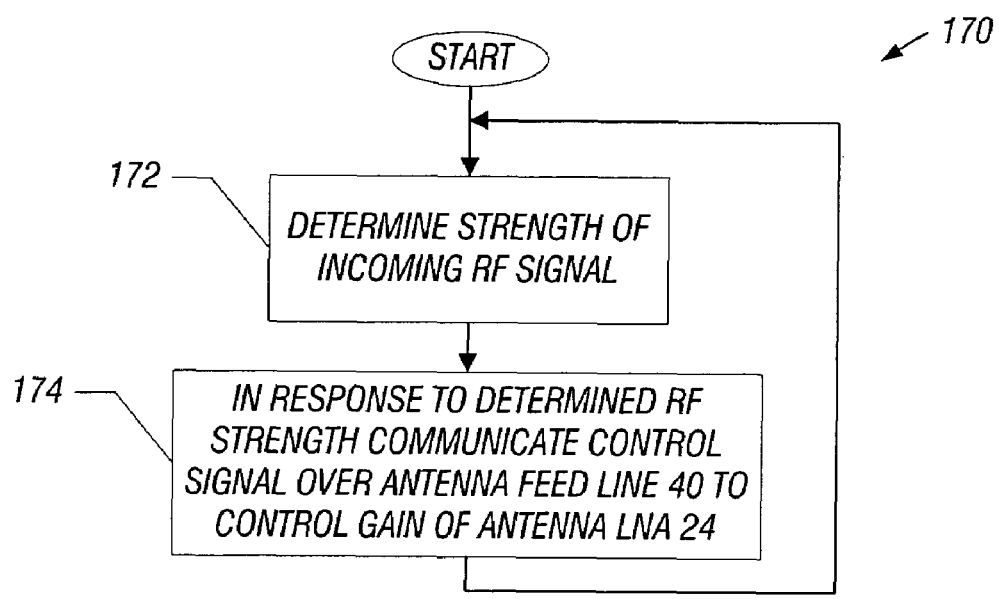

In a more specific embodiment of the invention, a technique 170, that is depicted in FIG. 5, may be used to control the LNA 24. Referring to FIG. 5, pursuant to the technique 170, the strength of the incoming RF signal is determined, as depicted in block 172. In response to the determined strength, a control signal is communicated over the antenna feedline 40 to control the gain of the LNA 24, as depicted in block 174.

Figure 6:
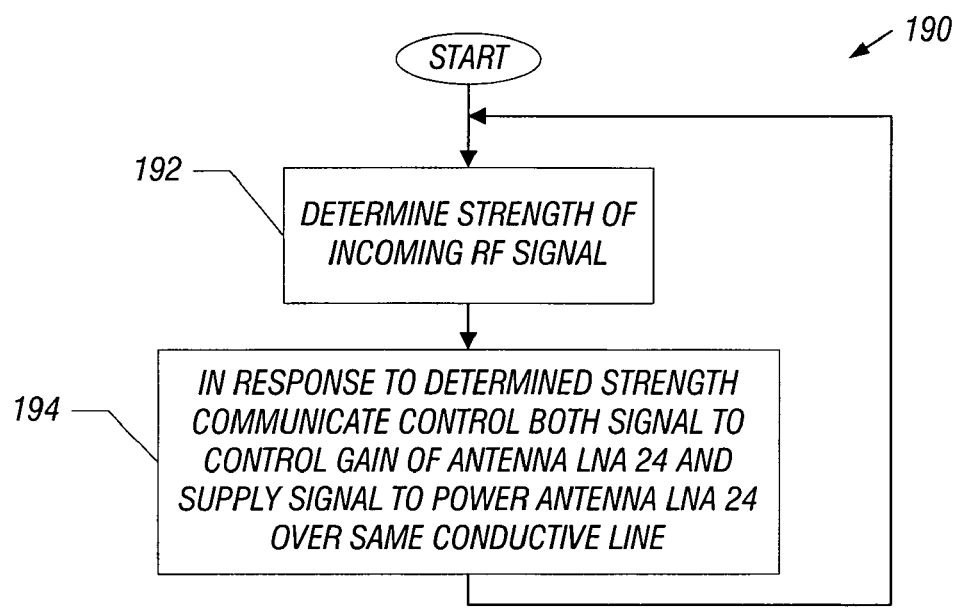

As a more specific example, FIG. 6 depicts a technique 190. Referring to FIG. 6, pursuant to the technique 190, the strength of an incoming RF signal is determined, as depicted in block 192. Next, in response to the determined strength, both a control signal to control the gain of the LNA 24 as well as a supply signal to power the LNA 24 are communicated (block 194) over the same conductive line. As pointed out above, in some embodiments of the invention, this conductive line may be a conductive line (the center conductive line, for example) of the antenna feedline 40. In some embodiments of the invention, the signal to control gain and the signal to provide power may be the same signal (as described above in connection with FIG. 1).

Thus, in some embodiments of the invention, a satellite radio receiver system includes a tuner to receive a radio frequency satellite signal that primarily originates either from a terrestrial repeater (potentially causing overload of the tuner, if not for the features of the present invention) or from the satellite. The satellite receiver system compensates for the signal strength difference by furnishing a control signal to the antenna feedline for purposes of controlling the gain of the active antenna. Thus, if the satellite radio receiver system is in proximity to a terrestrial repeater, the satellite radio receiver system may adjust the gain of the active antenna to attenuate the received radio frequency signal. However, if the satellite radio receiver system is located away from a terrestrial repeater so that the incoming signal from the satellite dominates, then the satellite radio receiver system may adjust the gain of the active antenna to amplify the received radio frequency signal. Many variations are possible and are within the scope of the appended claims.

Other techniques and circuits to control the gain of the remote antenna 20 are possible and are within the scope of the appended claims. For example, in some embodiments of the invention, a supply current (instead of a supply voltage) may be communicated across the antenna feedline 40 for purposes of powering the LNA 24 and remote circuitry and for purposes of controlling the gain of the LNA 24. Thus, at least one of a supply voltage and a supply current may be communicated across the antenna feedline 40 for purposes of controlling the gain of the LNA 24 and communicating power to the LNA 24 (and possibly other remote circuitry), in some embodiments of the invention.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   compensating for a signal strength difference between a first radio frequency signal primarily originating from a terrestrial repeater and a second radio frequency signal primarily originating from a satellite, comprising generating a control signal indicative of a strength of a radio frequency signal produced by an amplifier that drives an antenna feedline; and
   controlling a gain of the amplifier in response to the control signal.

2. The method of claim 1, wherein the act of generating comprises:
   receiving a radio frequency signal produced by the amplifier from an end of the antenna feedline opposite from another end of the antenna feedline coupled to the antenna.

3. The method of claim 1, further comprising:
   communicating the radio frequency signal produced by the amplifier to a radio frequency tuner, wherein a magnitude of the radio frequency signal produced by the amplifier is adjusted before the radio frequency signal produced by the amplifier is received by the tuner.

4. The method of claim 1, further comprising:
   communicating the control signal over the antenna feedline to control the gain.

5. The method of claim 4, wherein the act of communicating the control signal comprises:
   providing the control signal to a first end of the antenna feedline; and
   receiving the control signal from a second end of the antenna feedline,
   the first end of the antenna feedline being closer to a radio frequency tuner than the second end of the antenna feedline and the second end of the antenna feedline being closer to the amplifier than the first end of the antenna feedline.

6. The method of claim 1, wherein the antenna feedline has a length greater than approximately one foot.

7. The method of claim 1, further comprising:
   providing at least one of a supply voltage and a supply current to the antenna feedline to power the amplifier.

8. The method of claim 7, further comprising:
   providing the control signal and said at least one of the supply voltage and the supply current to the antenna feedline.

9. The method of claim 7, further comprising:
   providing the control signal and said at least one of the supply voltage and the supply current to a single conductor of the antenna feedline.

10. The method of claim 7, wherein the control signal and said at least one of the supply voltage and the supply current are the same.

11. The method of claim 7, further comprising:
    providing the control signal and said at least one of the supply voltage and the supply current to a single conductor.

12. The method of claim 11, wherein the control signal and said at least one of the supply voltage and the supply current are the same.

13. A system comprising:
    an antenna to provide a satellite radio frequency signal;
    an antenna feedline;
    an amplifier to amplify the radio frequency signal to provide an amplified radio frequency signal to the antenna feedline;
    a satellite receiver coupled to the antenna feedline to generate an audio signal in response to the amplified satellite radio frequency signal; and
    a circuit to generate a control signal to control a gain of the amplifier in response to a strength of the satellite radio frequency signals,
    wherein the circuit attenuates the satellite radio frequency signal when the satellite radio frequency signal originates from a terrestrial repeater and amplifies the satellite radio frequency signal when the satellite radio frequency signal originates from a satellite.

14. The system of claim 13, wherein the circuit transmits the control signal to the antenna feedline.

15. The system of claim 14, wherein the circuit provides the control signal to a first end of the antenna feedline, the first end of the antenna feedline being closer to the circuit than a second end of the antenna feedline and the second end of the antenna feedline being closer to the amplifier than the first end of the antenna feedline.

16. The system of claim 13, wherein the antenna feedline has a length greater than approximately one foot.

17. The system of claim 13, wherein the circuit provides at least one of a supply voltage and a supply current to the antenna feedline to power the amplifier.

18. The system of claim 17, wherein the circuit provides the control signal to the antenna feedline.

19. A receiver comprising:
    a tuner to receive a first radio frequency signal in response to an antenna receiving a second radio frequency signal from at least one of a terrestrial repeater and a satellite; and
    a circuit to transmit a control signal to an antenna feedline to compensate for a signal strength difference between the second radio frequency signal primarily originating from the terrestrial repeater and the second radio frequency signal primarily originating from the satellite.

20. The receiver of claim 19, wherein the antenna feedline has a length greater than approximately one foot.

21. The receiver of claim 19, wherein the circuit provides at least one of a supply voltage and a supply current to the antenna feedline to power an amplifier.

22. The receiver of claim 21, wherein the control signal and said at least one of the supply voltage and the supply current are provided to a single conductor of the antenna feedline.

23. The receiver of claim 21, wherein the control signal and said at least one of the supply voltage and the supply current are the same.

* * * * *

UNITED STATES PATENT AND TRADEMARK OFFICE
CERTIFICATE OF CORRECTION

PATENT NO. : 7,386,284 B2 Page 1 of 1
APPLICATION NO. : 11/001282
DATED : June 10, 2008
INVENTOR(S) : Charles D. Thompson It is certified that error appears in the above-identified patent and that said Letters Patent is hereby corrected as shown below:

Column 8:
Line 19, "signals" should be --signal--.

Signed and Sealed this

Fifth Day of August, 2008

JON W. DUDAS
*Director of the United States Patent and Trademark Office*